United States Patent [19]

Krupa, Jr.

[11] Patent Number: 5,786,688
[45] Date of Patent: Jul. 28, 1998

[54] ELECTRICAL AMMETER INCLUDING AN INDUCTION COIL

[75] Inventor: Robert L. Krupa, Jr., Parma, Ohio

[73] Assignee: Prime Instruments, Inc., Cleveland, Ohio

[21] Appl. No.: 461,642

[22] Filed: Jun. 5, 1995

[51] Int. Cl.⁶ .................... G01R 35/04; G01R 1/20
[52] U.S. Cl. ........................... 324/146; 324/151 R
[58] Field of Search ........................... 324/146, 151 R, 324/117 R, 151 A, 147

[56] References Cited

U.S. PATENT DOCUMENTS

| | | | |
|---|---|---|---|
| 1,663,768 | 3/1928 | Miller | 324/146 |
| 3,054,054 | 9/1962 | Donker | 324/146 |
| 4,646,007 | 2/1987 | Faria | 324/146 |
| 4,710,706 | 12/1987 | Krupa, Jr. | 324/146 |

*Primary Examiner*—Walter E. Snow
*Attorney, Agent, or Firm*—Renner, Otto, Boisselle & Sklar, P.L.L.

[57] ABSTRACT

An electrical meter, comprising a housing, a motor magnet mounted relative to a housing for pivotal movement, and an induction clip having an arcuate portion of more than 180 degrees, opposite ends of the arcuate being anchored to the housing to define an area within which a conductor is maintained within the radius of the arcuate portion.

14 Claims, 2 Drawing Sheets

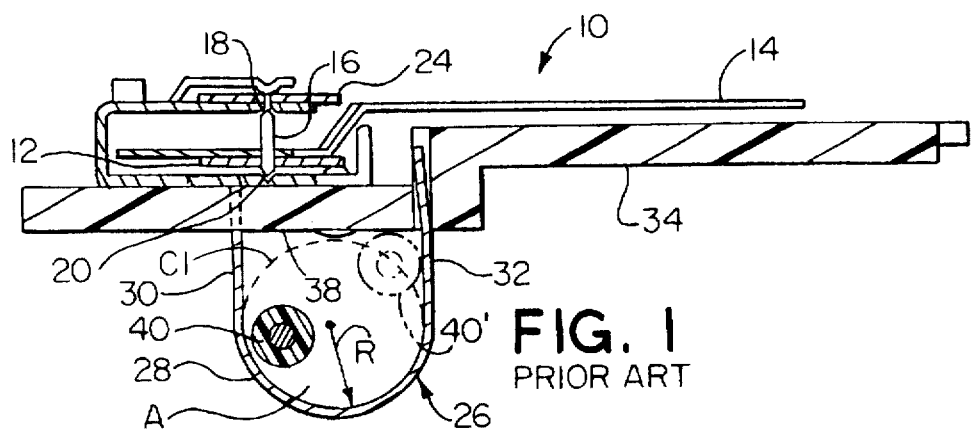
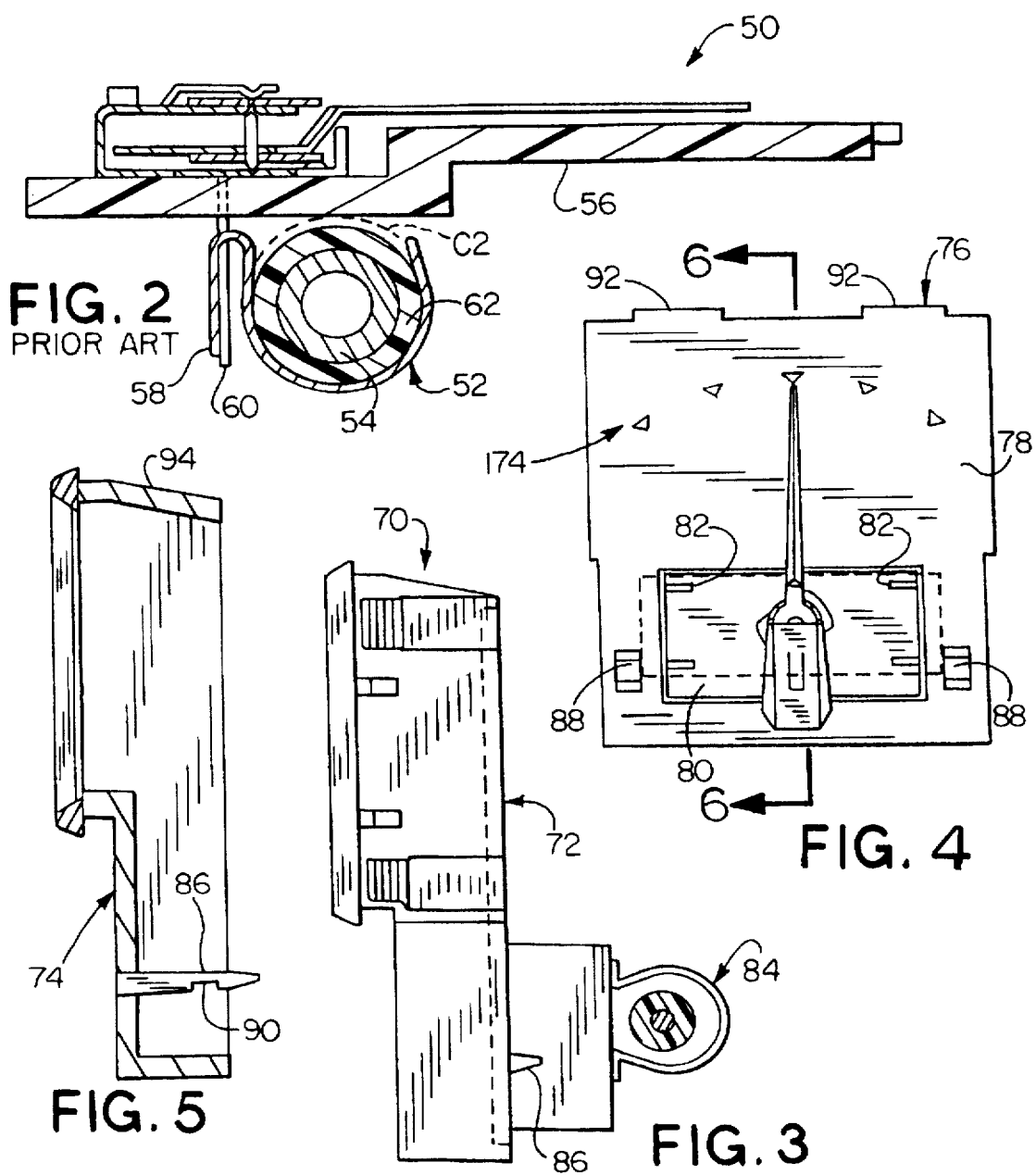

5,786,688

ELECTRICAL AMMETER INCLUDING AN INDUCTION COIL

TECHNICAL FIELD OF THE INVENTION

The invention herein disclosed relates generally to an electrical meter and, more particularly, to an economical and rugged ammeter.

BACKGROUND OF THE INVENTION

Electrical meters such as ammeters have heretofore employed a pivoted motor magnet which is connected to a pointer. The prior ammeters have further included a holding magnet mounted in operative relation to the motor magnet to influence the motor magnet and pointer constantly toward a zero position. The motor magnet is positioned proximate an induction clip included in the ammeter. The induction clip is designed to maintain a conductor or wire in close physical relation to the meter and, particularly, in relation to the motor magnet. In operation, when a current is passed through the conductor or wire, a magnetic field is produced which is shaped and directed via the induction clip. This magnetic field influences the motor magnet and pointer from the zero position. The strength of the magnetic field is a function of the magnitude of the current passing through the conductor. Hence, the degree of movement of the motor magnet and pointer from the zero position is also a function of the magnitude of the current. Thus, the magnitude of the current can be determined based upon how far the motor magnet and pointer deflect from the zero position, the zero position representing no current flow through the conductor.

There are, however, a number of disadvantages associated with conventional ammeters employing an induction clip. For example, as explained more fully below, induction clips for retaining the conductor proximate the motor magnet have had a shape which would allow the conductor to move outside the general radius of curvature of the clip. As a result, the accuracy of the ammeter could suffer. In addition, induction clips in prior art ammeters have been prone to bending which could further reduce the accuracy of the meter.

Other drawbacks associated with conventional ammeters included a relatively complex mounting mechanism for the motor magnet which required numerous assembly steps and parts. Consequently, this resulted in increased production costs of the ammeter.

SUMMARY OF THE INVENTION

The present invention is directed towards overcoming the aforementioned shortcomings and drawbacks associated with conventional ammeters.

According to one aspect of the invention, an electrical meter is provided which includes a housing, a motor magnet mounted relative to the housing for pivotal movement, and an induction clip defining an area within which may be constrained a conductor through which current passes to generate a magnetic field that reacts with the magnetic field of the motor magnet to influence a pivotal position of the motor magnet. The meter is characterized by an arcuate portion of the induction clip having an arcuate length of more than 180 degrees between opposite end portions anchored to the housing, whereby the conductor will be held within the radius of curvature of the clip.

In a preferred embodiment, the arcuate portion of the induction clip has an arcuate length of at least about 230 degrees between the end portions of the clip, with the opposing end portions of the induction clip being secured to the housing of the meter such that the area within which the conductor is maintained is bordered exclusively by the arcuate portion and the housing. Also, in a preferred embodiment, one or both end portions of the clip include a pair of tabs and an intermediate ear, the ear engaging an outer surface of a wall of the housing, and the tabs passing through apertures in the housing wall and being bent over an inner surface of the housing wall to trap the housing wall between the ear and tabs, thereby to secure the end of the induction clip to the housing.

According to another aspect of the invention, an electrical meter is provided having a housing, a motor magnet on one side of a wall of the housing, and an induction clip having an arcuate portion disposed on an opposite side of the housing wall. The arcuate portion of the clip defines with a surface of the wall an area through which a conductor may pass for generating a magnetic field reactive with the magnetic field of the motor magnet to influence pivotal movement of the motor magnet. The ends of the arcuate portion extend to such wall surface such that the wall surface defines a chordal closure of the arcuate portion, i.e., the general radius of curvature of the arcuate portion extends at least beyond the wall surface and towards the motor magnet.

According to still another aspect of the invention, a meter is provided which includes a housing having a wall with a hole therein, a pivot pin having one end fitted in the hole and extending from the wall, a sleeve bearing rotatably engaged with the pivot pin, and a motor magnet affixed to the sleeve bearing.

In a preferred embodiment, the pivot pin includes a radial projection, such as a flange, for securing a holding magnet to the housing at a location between the motor magnet and the wall. The holding magnet functions to influence the motor magnet toward a starting position. Furthermore, the meter includes a clip for maintaining a conductor proximate to the motor magnet, such that current in the conductor will establish a magnetic field to influence movement of the motor magnet and the sleeve bearing.

The foregoing and other features of the invention are hereinafter fully described and particularly pointed out in the claims, the following description and the annexed drawings setting forth in detail a certain illustrative embodiment of the invention, this being indicative, however, of but one of the various ways in which the principles of the invention may be employed.

BRIEF DESCRIPTION OF THE DRAWINGS

FIGS. 1 and 2 are sectional views of prior art ammeters.

FIG. 3 is a side view of an electrical measuring meter according to the present invention.

FIG. 4 is a top view of the back plate of the meter illustrated in FIG. 3.

FIG. 5 is sectional view of only the front cover of the meter illustrated in FIG. 3.

DETAILED DESCRIPTION

Figure 6:
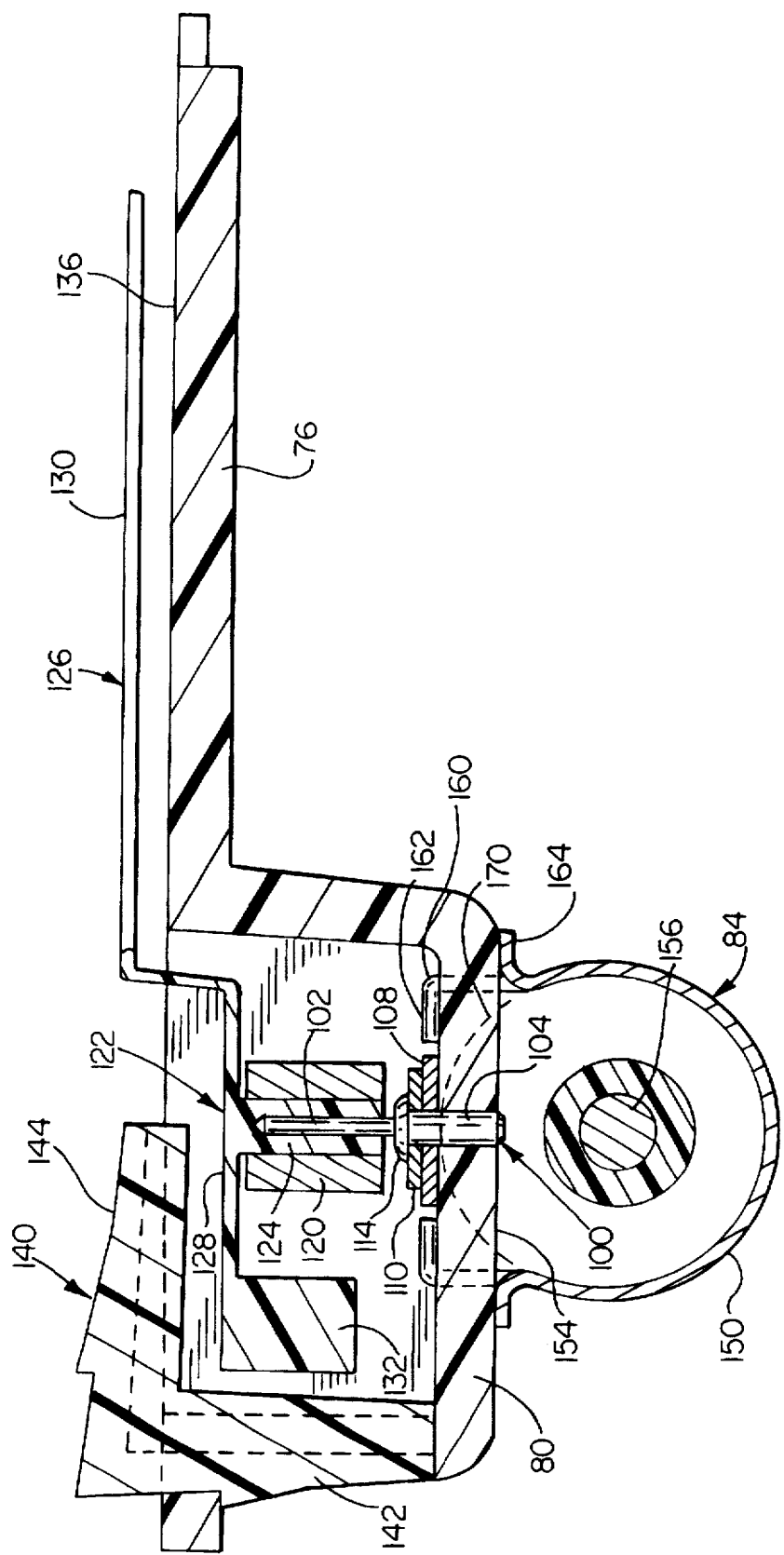
FIG. 6 is a sectional view of the back plate illustrated in FIG. 4 along the line 6—6 thereof.

Initially, reference is made to FIGS. 1 and 2 which illustrate exemplary configurations of prior art ammeters. FIG. 1 illustrates a conventional ammeter 10 in which a motor magnet 12 and pointer 14 are mounted to a shaft 16 which is journalled between two axially spaced jewel bearings 18 and 20. Unfortunately, this spaced bearing type of mount makes meter assembly both relatively difficult and costly. The ammeter further includes a holding magnet 24 and an induction clip 26 disposed on opposite sides of the motor magnet 12. The clip 26 has a generally U-shape cross-section.

More specifically, the clip 26 has an arched or arcuate portion 28 having a radius R and two parallel legs 30 and 32 extending tangentially from the arcuate portion 28. The legs 30 and 32 are connected to a housing 34 such that outer portions thereof and the arcuate portion 28 defined with an outer wall surface 38 of the housing an area A for maintaining a conductor 40 passing therethrough in close proximate relationship to the motor magnet 12.

In use, the current passing through the conductor 40, which is the current to be measured, produces a magnetic field surrounding the conductor. The induction clip 26, which is made of a ferromagnetic material, functions to shape and direct the magnetic field produced via the conductor such that the magnetic field interacts with the motor magnet 12 in order to deflect the pointer 14 as a function of the magnitude of the current.

It has been found that the U-shape configuration of the induction clip 26 can adversely affect the calibration of the ammeter depending upon the position of a conductor 40 within the area A. For example, if the conductor remains within a circle C1 (shown partially in phantom) defined by the radius R of the arcuate portion 28 of the induction clip as shown in FIG. 1, the calibration of the meter remains accurate within acceptable tolerances. It is possible, however, that the conductor may locate substantially outside the circle C1 as shown at 40' in FIG. 1. As a result, the calibration of the meter is adversely affected and the accuracy of the measurement is compromised.

In other ammeters, such as the ammeter 50 shown in FIG. 2, a C-shape induction clip 52 is used. The clip may be used with or without a current tube 54 through which the current to be measured is conducted, as by attachment of leads to opposite ends of the current tube. The clip is secured at a reversibly bent tail portion 58 to connecting members 60 which project from the back of the meter housing. The current tube is electrically insulated from the connecting members 60 and insulators 62.

The connecting members 58 and the clip 52 are susceptible to bending when bumped or jostled. The resultant movement of the clip from its original position has been found to affect the calibration of the ammeter 50 as much as 15% to 20%.

Even in the case where the clip 52 remains in its original position as shown in FIG. 2, the meter 50 is not necessarily optimized with respect to sensitivity. More specifically, the generally circular cross section of the inductive clip 52 represents the primary path of the magnetic flux lines induced therein. As shown in FIG. 2, this primary flux path remains substantially below the motor magnet thus reducing the sensitivity of the meter.

Referring now to FIGS. 3 through 6, and initially to FIG. 3, an electrical meter, such as an ammeter, according to the present invention is indicated generally by reference numeral 70. The meter 70 includes a housing 72 consisting of a front cover 74 (FIG. 5) and a back plate 76 (FIG. 4). As best illustrated in FIG. 4, the back plate 76 has an upper planar portion 78 and a lower portion including a cavity having a rearwardly recessed wall 80 parallel to the upper planar portion 78. As can be seen in FIG. 4, the recessed wall 80 includes a number of slot-like openings 82. In a preferred embodiment, there are four such openings one of which is located at each of the four corners of the recessed wall 84. The slot-like openings 82 are used for mounting an induction clip 84 to the back of the recessed wall as is shown in FIG. 3.

The front cover 74 and back plate 76 are preferably made of an electrically non-conductive material having low magnetic permeability such as a plastic or plastic-like material. For example, in a preferred embodiment, the housing may be made of high impact ABS plastic.

The front cover 74 and back plate 76 are fitted together in a manner which provides a secure connection between the two parts. Preferably, the front cover includes a pair of tapered projections 86, as illustrated in FIG. 5, which can be inserted through a pair of openings 88 (FIG. 4) in the upper portion of the back plate 76. The projections 86 each have a notch 90 whose width is approximately the same as the thickness of the back plate 76 for catching the back plate. The back plate 76 is further secured to the front cover by a pair of tabs 92 at its upper edge which engage in slots (not shown) correspondingly located in the top wall 94 of the front cover.

Referring now to FIG. 6, at approximately the center of the recessed wall 80 there is provided a bearing support member 100. The bearing support member 100 includes a pivot pin or axle 102 which extends from an enlarged base portion 104 of the bearing support member perpendicular to the back plate 76. The recessed wall 80 includes a hole into which the enlarged base portion is press fit. Concentrically supported on the bearing support member 100 is a permanent bipolar magnet 108, hereinafter referred to as the holding magnet. Also concentrically supported on the bearing support member atop the holding magnet is a calibration element 110. The holding magnet and calibration element are held in their respective positions against the recessed wall 80 by a collar flange 114 at the top end of the enlarged portion 104 of the bearing support member when the bearing support member is press fit into the opening in the recessed wall 80 of the back plate 76.

A second permanent bipolar magnet 120, hereinafter referred to as the motor magnet is of generally cylindrical shape and is rotatably mounted on the axle pivot pin 102 by a sleeve bearing mount 122. The sleeve bearing mount includes a cylindrical sleeve bearing 124 which is concentrically fitted in an axial centerbore of the motor magnet. The centerbore of the motor magnet may be provided, in known manner, with axially extending grooves into which the outer diameter of the sleeve-bearing is extruded when the sleeve bearing is pressed into the centerbore, thereby providing a positive lock against rotation of the sleeve-bearing relative to the motor magnet. After insertion of the sleeve bearing, the end thereof may be staked over the grooves. In a preferred embodiment, the sleeve bearing is integrally formed at its upper end with a pointer 126 which has a base portion 128 overlapping the top end of the motor magnet, an indicating portion 130 extending radially from the axis of the motor magnet, and a counterweight portion 132 extending radially opposite the indicating portion for locating the center of gravity of the pointer at the axis of the motor magnet.

The sleeve bearing 124 and pointer 126 are preferably molded from a plastic or plastic-like material as a single piece. As can be seen in FIG. 6, the indicating portion 130 of the pointer includes an offset such that the end of the indicating portion 130 extends in a spaced relationship over and parallel to the front face 136 of the upper portion of the back plate 76. The indicating portion 130, as will be appreciated from the description that follows, will deflect an amount which is indicative of the magnitude of the current which the meter 70 is measuring. The sleeve bearing mount, motor magnet, holding magnet, calibration element and pointer construction are similar to that shown in commonly assigned U.S. Pat. No. 4,710,706, the entire disclosure of which is incorporated herein by reference.

The sleeve bearing pointer and motor magnet are prevented from falling off the pivot pin by a stop 140. Preferably, the stop 140 is generally L-shape, with one leg 142 inserted and secured into an aperture located in the back plate 76, and the other leg 144 projecting out over the end of the pivot pin.

The induction clip 84, which is best illustrated in FIG. 6, has an arcuate central portion 150 of greater than 180 degrees. More particularly, the induction clip 84 extends through an arc in the range of about 200–290 degrees, more preferably in the range of about 230–280 degrees, and still more preferably in the range of about 250–270 degrees. Moreover, in the preferred embodiment, both ends of the arcuate portion 150 terminate at the rear surface 154 of the recessed wall 80 as shown in FIG. 6, the outer surface of the recessed wall extending along a chord of the circle defined by the radius of the arcuate portion. As a result, a conductor 156, which carries the current being measured, is forced to remain within the radius of curvature of the arcuate portion 150.

Each end of the induction clip 84 includes a pair of tabs 160 which align with the openings 82 in the recessed wall 80. To mount the clip to the back plate, the tabs 160 are inserted through the openings 82 and the inwardly projecting portions 162 thereof, or ears, are bent over the inside surface of the recessed wall so as to secure both ends to the back plate. Each end of the induction clip also includes between the tabs a central flange or ear 164 which is bent to engage the outer surface of the recessed wall 154. The ear 164 and ears 162 at the ends of the tabs provide positive securement of the clip to the back plate.

Because both ends of the induction clip are anchored securely to the back plate, the induction clip cannot be easily bent or otherwise deformed from its original position relative to the motor magnet. As a result, the meter is much more durable and reliable so as to remain in calibration as compared to the embodiment discussed above in relation to FIG. 2.

It is further noted that the general radius of curvature of the induction clip extends well into the back plate as represented by broken line 170. As a result, the magnetic flux developed in the induction clip will tend to follow a primary path which is directed more closely to the motor magnet on the opposite side of the back plate as compared to the embodiment shown in FIG. 2. As shown, the circle defined by the radius of the arcuate portion 150 extends through more than half the thickness of the recessed wall. Due to the closer proximity of the motor magnet to the flux lines developed in the induction clip, the meter is capable of providing increased sensitivity with respect to current measurements or the like. It also is noted that the center of the circle of the arcuate portion is in line with the pivot axis of the motor magnet.

The induction clip 84 may be made of a low carbon transformer iron, or some other similar material having relatively high magnetic permeability. The inner surface of the induction clip should be generally smooth with no burrs or other sharp projections to prevent possible puncture of the insulating material surrounding the conductor inserted therethrough.

The meter will now be described in relation to its operative characteristics.

The magnetic field of the holding magnet 108 reacts with the magnetic field of the motor magnet 120 to provide a starting point adjustment for the pointer 126. For example, the magnetic interaction between the holding magnet and the motor magnet adjusts the pointer so that it indicates a zero reading on a meter scale 174 (FIG. 4), which may be printed on the upper portion of the back plate 78, when no current is passing through the conductor. Further, the magnetic field of the holding magnet tends to pull the motor magnet toward the holding magnet such that the top of the sleeve bearing 124 is in contact with the top of the pivot pin 102. This downward magnetic attraction between the holding magnet and the motor magnet substantially eliminates any axial movement of the pointer as it rotates about the pivot pin.

The calibration element 110 is preferably made of a magnetically soft material having high magnetic permeability, such as a soft iron disc, and, as mentioned, is concentrically mounted on the bearing support member 100 between the holding magnet and the motor magnet. The calibration element, being in direct magnetic contact with the holding magnet, is magnetized by the holding magnet 108. This results in a subtracting of magnetic intensity from the holding magnet vis-a-vis the motor magnet and thus a partial cancellation of the holding magnet's magnetic field intensity in the region of the motor magnet 30. Essentially, the calibration element acts as a magnetic shunt interposed between the holding magnet and the motor magnet to reduce the effective magnetism of the holding magnet.

The reduction in magnetic intensity is a function of the size of the calibration element, as is more fully discussed in the above-referenced U.S. Pat. No. 4,710,706.

To use the meter 70 of the present invention, the conductor 156, such as a copper wire, is inserted through the induction clip 84. The current to be measured flows in the conductor 156 generating a magnetic field which magnetizes the induction clip. The relative strength of this magnetic field is a function of the magnitude of the current flowing in the conductor. The magnetic field generated by the current flowing in the conductor reacts with the magnetic field of the motor magnet 120 to effect a motor action which causes the motor magnet, and hence the pointer 126, to rotate against the holding force of the holding magnet. The amount of rotation of the motor magnet is a function of the relative strength of this magnetic field, which in turn is a function of the magnitude of the current flowing in the conductor. Thus, the pointer will deflect an amount which indicates the magnitude of the current.

Although the invention has been shown and described with respect to an exemplary embodiment thereof, it is obvious that equivalent alterations and modifications will occur to others skilled in the art upon the reading and understanding of this specification. For example, although the invention has been described primarily in the context of a meter to provide a direct measurement of current (i.e., an ammeter), it will be appreciated that the invention has utility in connection with any type of electrical meter which relies, at least in part, on a measurement determined by or based on an induction movement. The present invention includes all such equivalent alterations and modifications.

What is claimed is:

1. An electrical meter, comprising:
   a housing;
   a motor magnet mounted relative to said housing for pivotal movement; and an induction clip defining an area within which may be constrained a conductor through which current passes generating a magnetic field that reacts with the magnetic field of said motor magnet to influence pivotal movement of said motor magnet, said induction clip including an arcuate length of more than 180 degrees between opposite end portions anchored to said housing, and said arcuate portion defining an interior bight space open at one side to a surface of said wall of said housing.

2. A meter according to claim 1, wherein said arcuate portion has an arcuate length more than 230 degrees.

3. A meter according to claim 1, wherein said induction clip is magnetizable by said magnetic field generated by said current flowing in said conductor.

4. A meter according to claim 3, wherein each end of said induction clip includes a pair of tabs which pass through apertures in said housing and are bent over an inner surface of said housing to secure said induction clip to said housing.

5. A meter according to claim 1, wherein said area is bordered substantially exclusively by said arc and said housing.

6. A meter, comprising:

a housing;

a motor magnet disposed on one side of a wall of said housing; and an induction clip having an arcuate portion disposed on an opposite side of said housing wall, the arcuate portion of the clip defining with a surface of the wall an area through which a conductor may pass for generating a magnetic field that reacts with the magnetic field of said motor magnet to influence pivotal movement of said motor magnet, said arcuate portion having an inner surface defining a circle that has a portion thereof extending at least halfway through the thickness of said wall of said housing, and said arcuate portion having opposite end portions located closer to said wall of said housing than an intermediate portion of said arcuate portion, thereby to enable retention of the conductor between said arcuate portion and said back wall of said housing.

7. A meter according to claim 6, wherein said ends of said arcuate portion each terminate at a pair of tabs which pass through apertures in said housing and are bent over an inner surface of said housing to secure said induction clip to said housing.

8. A meter according to claim 6, wherein said arcuate portion of said induction clip extends in a substantially continuous arc greater than 180 degrees.

9. An meter according to claim 8, wherein said arc extends at least about 210 degrees.

10. A meter according to claim 6, wherein said induction clip has ends each of which are secured to said housing.

11. An electrical meter, comprising:

a housing including a wall having a hole therein;

a pivot pin having one end in pressed fit engagement with said hole, said pivot pin extending substantially normal from said wall; and a sleeve bearing rotatably engaged with said pivot pin and a motor magnet affixed to said sleeve bearing.

12. A meter according to claim 11, said pivot pin including a flange for securing a holding magnet between said motor magnet and said wall and wherein said holding magnet functions to influence said motor magnet toward a starting position.

13. A meter according to claim 11, further including a clip for maintaining a conductor proximate said motor magnet for conducting a current which establishes a magnetic field to influence movement of said motor magnet and sleeve bearing.

14. A meter according to claim 11, wherein said wall is electrically non-conductive.

* * * * *